(12) United States Patent
Lee et al.

(10) Patent No.: US 12,142,492 B2
(45) Date of Patent: Nov. 12, 2024

(54) METHOD FOR TREATING SUBSTRATE AND APPARATUS FOR TREATING SUBSTRATE

(71) Applicant: SEMES CO., LTD., Cheonan-si (KR)

(72) Inventors: Ji-Hwan Lee, Suwon-si (KR); Seong Gil Lee, Hwaseong-si (KR); Dong Sub Oh, Busan (KR); Myoungsub Noh, Seoul (KR); Dong-Hun Kim, Seoul (KR); Wan Jae Park, Hwaseong-si (KR)

(73) Assignee: SEMES CO., LTD., Cheonan-si (KR)

( * ) Notice: Subject to any disclaimer, the term of this patent is extended or adjusted under 35 U.S.C. 154(b) by 308 days.

(21) Appl. No.: 16/952,071

(22) Filed: Nov. 18, 2020

(65) Prior Publication Data

US 2021/0151333 A1    May 20, 2021

(30) Foreign Application Priority Data

Nov. 19, 2019  (KR) ........................ 10-2019-0149016

(51) Int. Cl.
*H01L 21/67* (2006.01)
*H01J 37/32* (2006.01)
*H01L 21/687* (2006.01)

(52) U.S. Cl.
CPC .... *H01L 21/67051* (2013.01); *H01J 37/3244* (2013.01); *H01J 37/32715* (2013.01); *H01J 37/32788* (2013.01); *H01L 21/68764* (2013.01); *H01J 2237/3344* (2013.01)

(58) Field of Classification Search
None
See application file for complete search history.

(56) References Cited

U.S. PATENT DOCUMENTS

| | | | |
|---|---|---|---|
| 6,800,139 B1* | 10/2004 | Shinriki | C23C 16/45589 156/345.33 |
| 6,936,906 B2* | 8/2005 | Chung | C23C 14/165 257/E21.171 |
| 8,066,895 B2* | 11/2011 | Belen | C23C 16/45574 216/67 |
| 9,004,006 B2* | 4/2015 | Kao | C23C 16/45565 118/715 |
| 2004/0103844 A1* | 6/2004 | Chou | C23C 16/45561 156/345.34 |

(Continued)

FOREIGN PATENT DOCUMENTS

| | | |
|---|---|---|
| JP | 2000-239864 | 9/2000 |
| KR | 10-1347149 | 9/2006 |
| KR | 1020080020720 A  * | 3/2008 |

(Continued)

OTHER PUBLICATIONS

Machine Generated English Translation of the abstract of KR 10-2010-0054502. Published May 25, 2010 (Year: 2010).*

(Continued)

*Primary Examiner* — Sylvia MacArthur (57) ABSTRACT

A method for processing a substrate includes providing the substrate, a film being formed on the substrate, performing pretreatment to surface-treat the film formed on the substrate using a treatment gas in a plasma state, and performing, after the pretreatment, liquid treatment to remove the film from the substrate by supplying a treatment liquid onto the substrate.

8 Claims, 8 Drawing Sheets

(56) References Cited

U.S. PATENT DOCUMENTS

| | | | | |
|---|---|---|---|---|
| 2005/0233093 | A1* | 10/2005 | Tada | H01L 21/28562 257/E21.171 |
| 2005/0247667 | A1* | 11/2005 | Kim | H01L 21/67069 156/345.39 |
| 2007/0187363 | A1* | 8/2007 | Oka | H01J 37/32449 156/345.33 |
| 2011/0226181 | A1* | 9/2011 | Yamamoto | C23C 16/16 118/724 |
| 2015/0083330 | A1* | 3/2015 | Madiwal | C23C 16/4401 156/345.31 |
| 2016/0013079 | A1* | 1/2016 | Choi | H01L 21/67051 156/345.21 |
| 2020/0194233 | A1* | 6/2020 | Kao | H01J 37/32449 |
| 2021/0151333 | A1* | 5/2021 | Lee | H01J 37/32788 |

FOREIGN PATENT DOCUMENTS

| | | | |
|---|---|---|---|
| KR | 10-2008-0019109 | | 7/2008 |
| KR | 10-2008-0020720 | | 7/2008 |
| KR | 1020100054502 | * | 5/2010 |
| KR | 10-2016-0001661 | | 1/2016 |
| KR | 10-2015-0060920 | | 8/2020 |

OTHER PUBLICATIONS

Machine Generated English Translation of the claims of KR 10-2010-0054502. Published May 25, 2010 (Year: 2010).*
Machine Generated English Translation of the specification of KR 10-2010-0054502. Published May 25, 2010 (Year: 2010).*
Office Action from the China National Intellectual Property Administration dated May 20, 2024.

* cited by examiner

METHOD FOR TREATING SUBSTRATE AND APPARATUS FOR TREATING SUBSTRATE

CROSS-REFERENCE TO RELATED APPLICATION

This application claims priority under 35 U.S.C. § 119 to Korean Patent Application No. 10-2019-0149016, filed on Nov. 19, 2019, in the Korean Intellectual Property Office, the entire contents of which are hereby incorporated by reference.

BACKGROUND

Embodiments of the inventive concept disclosed herein relate to a method and an apparatus for treating a substrate, and more particularly, relate to a method and an apparatus for removing a membrane from a substrate.

In general, a semiconductor device is manufactured by repeatedly performing various unit processes such as a thin film depositing process, a photolithography process, an etch process, a cleaning process, and a polishing process.

Among them, the etch process is to remove a membrane formed from a substrate. The membrane may be a thin film to form a pattern or a natural oxide film. The etch process is classified into a wet etch process and a dry etch process depending on manners to perform the processes.

According to the dry etch process, the film on a substrate is etched using plasma. In general, the dry etch process is performed by allowing ion particles contained in plasma to collide with the substrate. The plasma refers to the state of ionized gas containing ions, electrons, and radicals. In general, to form the plasma, an electromagnetic field is formed in the inner space of the chamber, and the electromagnetic field excites the process gas provided in the chamber into a plasma state. The plasma is produced by very high temperatures, strong electric fields, or radio frequency (RF) electromagnetic fields.

The dry etch process may etch the fine pattern in the substrate with higher accuracy. However, according to the dry etch process, by-products, such as polymers including carbon (C), oxygen (O), nitrogen (N) and fluorine (F), are produced and stick to a peripheral portion of the substrate. In addition, the substrate may be easily damaged by the plasma.

In general, according to the wet etch process, an etchant is applied to the substrate through a liquid supply nozzle while rotating the substrate, such that the etchant is spread over the entire surface of the substrate by centrifugal force, thereby etching the substrate.

The wet etch process has the advantages of low costs, a higher etching speed, and higher selectivity. However, according to the wet etch process, toxic waste is produced by the etchant, and the etchant is supplied to the central area of the substrate rotating such that the central area of the substrate is more etched than the edge area of the substrate.

SUMMARY

Embodiments of the inventive concept provide a method for treating a substrate and an apparatus for treating a substrate, capable of minimizing the damage to a substrate in a process of etching the substrate.

Embodiments of the inventive concept provide a method for treating a substrate and an apparatus for treating a substrate, capable of minimizing by-products in the process of etching the substrate.

Embodiments of the inventive concept provide a method for treating a substrate and an apparatus for treating a substrate, capable of minimizing an amount of etchant used in the process of etching the substrate.

Embodiments of the inventive concept provide a method for treating a substrate and an apparatus for treating a substrate, capable of increasing the etching efficiency used in the process of etching the substrate.

Embodiments of the inventive concept provide a method for treating a substrate and an apparatus for treating a substrate, capable of providing the uniform etching degree in the entire area of the substrate in the process of etching the substrate.

According to an exemplary embodiment, a method for processing a substrate includes providing the substrate, a film being formed on the substrate, performing pretreatment to surface-treat the film formed on the substrate using a treatment gas in a plasma state, and performing, after the pretreatment, liquid treatment to remove the film from the substrate by supplying a treatment liquid onto the substrate.

The surface-treating of the film includes changing a property of the film without etching the film.

The performing of the pretreatment includes supplying a first amount, per a unit area of the substrate, of the treatment gas to an edge area of the substrate, and supplying a second amount, per a unit area of the substrate, of the treatment gas to a central area of the substrate. The first amount of the treatment gas is different from the second amount of the treatment gas.

The first amount of the treatment gas is greater than the second amount of the treatment gas.

The performing of the liquid treatment includes supplying the treatment liquid onto a central area of the substrate during a time when the substrate is being rotated.

The film that is formed on the substrate is a natural oxide film. The treatment gas includes a hydrogen atom. The treatment gas includes a hydrogen gas or an ammonia gas. The treatment liquid includes fluorine.

According to an exemplary embodiment of the present invention, an apparatus for processing a substrate includes a controller, a plasma treatment unit coupled to the controller, a liquid treatment unit coupled to the controller, and a transferring unit coupled to the controller and disposed between the plasma treatment unit and the liquid treatment unit.

The controller control the plasma treatment unit to surface-treat a film of the substrate with a treatment gas in a plasma state, the transferring unit to transfer the substrate from the plasma treatment unit to the liquid treatment unit, and the liquid treatment unit to remove the film from the substrate with a treatment liquid.

The controller controls the plasma treatment unit to change a property of the film without etching the film.

The plasma treatment unit includes a process chamber having a treatment space inside the process chamber, a support unit supporting the substrate, a gas supply unit supplying the treatment gas into the process chamber, and a plasma source exiting the treatment gas to be in the plasma state.

The gas supply unit supplies a first amount, per a unit area of the substrate, of the treatment gas to an edge area of the substrate and a second amount, per a unit area of the substrate, of the treatment gas to a central area of the substrate. The first amount of the treatment gas is different from the second amount of the treatment gas.

The gas supply unit further includes a shower head supplying the treatment gas into the process chamber. The shower head includes a central area supply unit spraying the treatment gas to a central area of the substrate, and an edge area supply unit spraying the treatment gas to an edge area of the substrate.

The controller controls the gas supply unit such that a first amount, per a unit area of the substrate, of the treatment gas is supplied through the edge area supply unit and a second amount, per a unit area of the substrate, of the treatment gas is supplied through the central area supply unit. The first amount of the treatment gas is greater than the second amount of the treatment gas.

The liquid treatment unit includes a cup having a treatment space in the cup, a support unit rotatably supporting the substrate in the treatment space, and a liquid supply unit supplying the treatment liquid to the substrate supported by the support unit.

The liquid supply unit includes a nozzle moving between a process position in which the nozzle is vertically directed to a central area of the substrate and a standby position in which the nozzle is set aside from a vertical upper portion of the cup. The nozzle supplies, in the process position, the treatment liquid onto the central area of the substrate.

The film is a natural oxide film. The treatment gas includes a hydrogen atom. The treatment gas includes hydrogen gas or ammonia gas, and the treatment liquid includes fluorine.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

The embodiments of the inventive concept may be modified in various forms, and the scope of the inventive concept should not be construed to be limited by the embodiments of the inventive concept described in the following. The embodiments of the inventive concept are provided to describe the inventive concept for those skilled in the art more completely. Accordingly, the shapes and the like of the components in the drawings are exaggerated to emphasize clearer descriptions. Like reference numerals refer to like elements throughout the whole specification. The inventive concept is not limited to an embodiment disclosed herein.

Figure 1:
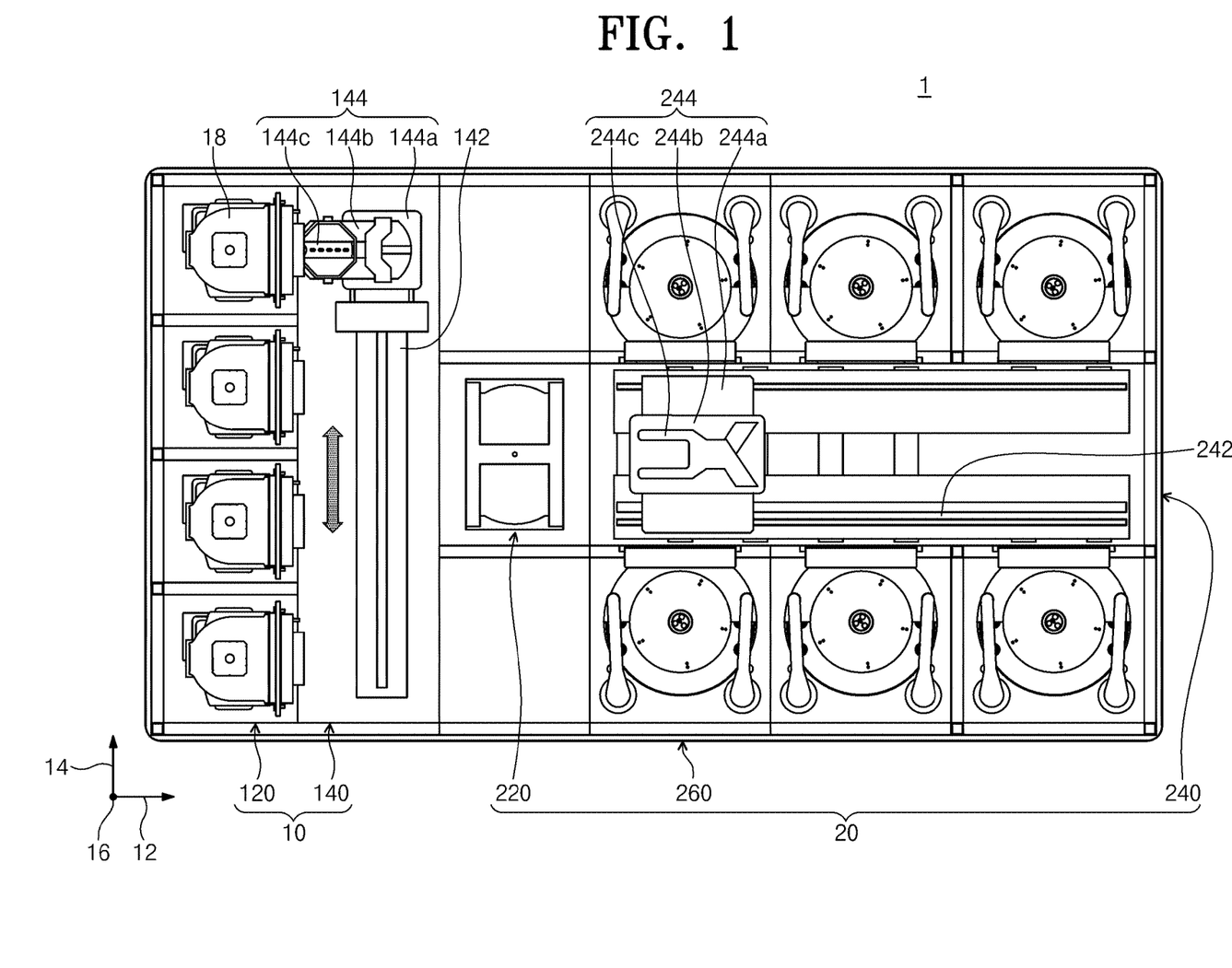
FIG. 1 is a view schematically illustrating a facility for treating a substrate, according to an embodiment of the inventive concept.

FIG. 1 is a view schematically illustrating a facility 1 for treating (i.e., processing) a substrate, according to an embodiment of the inventive concept. Referring to FIG. 1, the facility 1 for treating the substrate has an index module 10 and a process treating module 20 (i.e., a process treatment module), and the index module 10 includes a load port 120 and a transfer frame 140. The load port 120, the transfer frame 140, and the process treating module 20 may be sequentially arranged in a line. In an exemplary embodiment, the facility 1 may further include a controller to control the constituent elements of the facility 1, such as a plasma treating unit (i.e., a plasma treatment unit), a liquid treating unit (i.e., a liquid treatment unit) and a transferring unit. The controller may be operated with a software or firmware including information of a process condition for each constituent element and/or an operation sequence among the constituent elements. Those constituent elements, the process condition and the process sequence will be described later in detail. Hereinafter, a direction in which the load port 120, the transfer frame 140, and the process treating module 20 are arranged will be referred to as a first direction 12, a direction, which is perpendicular to the first direction 12 when viewed from above will be referred to as a second direction 14, and a direction, which is normal to a plane containing the first direction 12 and the second direction 14 while rising, will be referred to as a third direction 16.

A carrier 130 having a substrate 'W' received therein is seated on the load port 120. A plurality of load ports 120 are provided, and are arranged in the second direction 14 in a line. The number of the load ports 120 may increase or decrease depending on the process efficiency and a footprint condition of the process treating module 20 or a footprint. The carrier 130 has a plurality of slots (not illustrated) to receive the substrates 'W' arranged horizontally to the ground surface. A front opening unified pod (FOUP) may be used as the carrier 130.

The process treating module 20 has a buffer unit 220, a transferring chamber 240, and a process chamber 260. The transferring chamber 240 is disposed such that the longitudinal direction thereof is in parallel to the first direction 12. Process chambers 260 are disposed at opposite sides of the transferring chamber 240. The process chambers 260 may be arranged at one side and an opposite side of the transferring chamber 240 so as to be arranged symmetrically to each other about the transferring chamber 240. A plurality of process chambers 260 are provided at one side of the transferring chamber 240. Some of the process chambers 260 are arranged in the longitudinal direction of the transferring chamber 240. Furthermore, some of the process chambers 260 are arranged to be stacked on each other. That is, the process chambers 260 may be arranged in an A×B matrix at the one side of the transferring chamber 240. In this case, 'A' is the number of the process chambers 260 aligned in a line in the first direction 12, and 'B' is the number of the process chambers 260 aligned in a line in the third direction 16. When four or six process chambers 260 are provided at one side of the transferring chamber 240, the process chambers 260 may be arranged in 2×2 or 3×2. The number of the process chambers 260 may be increased or decreased. Alternatively, the process chamber 260 may be provided only at any one side of the transferring chamber 240. In addition, unlike, the process chamber 260 may be provided in a single layer at one side and opposite sides of the transferring chamber 240.

The buffer unit 220 is interposed between a transfer frame 140 and the transferring chamber 240. The buffer unit 220 provides a space in which the substrate 'W' stays, before the substrate 'W' is transferred between the transferring chamber 240 and the transfer frame 140. The buffer unit 220 is provided therein with a slot (not illustrated) in which the substrate 'W' is placed and a plurality of slots (not illustrated) are spaced apart from each other in the third direction 16. The buffer unit 220 is open in surfaces facing the transfer frame 140 and the transferring chamber 240.

The transfer frame 140 transfers the substrate 'W' between the carrier 130 seated on the load port 120 and the buffer unit 220. The transfer frame 140 includes an index rail 142 and an index robot 144. The index rail 142 is provided such that the longitudinal direction thereof is in parallel to the second direction 14. The index robot 144 is installed on the index rail 142 to move in the second direction 14 along the index rail 142. The index robot 144 may contain a base 144a, a body 144b, and an index arm 144c. The base 144a may be installed to be movable along the index rail 142. The body 144b may be coupled to the base 144a. The body 144b may be provided to be movable on the base 144a in the third direction 16. Furthermore, the body 144b may be provided to be rotatable on the base 144a. The index arm 144c may be coupled to the body 144b such that the index arm 144c is movable forward and backward with respect to the body 144b. A plurality of index arms 144c may be provided, and may be driven independently from each other. The index arms 114c are disposed to be stacked while being spaced apart from each other in the third direction 16. Some of the index arms 144c are used when transferring the substrates 'W' to the carrier 130 from the process treating module 20, and other of the index arms 144c may be used when transferring the substrates 'W' from the carrier 130 to the process treating module 20. This structure may prevent particles, which are produced from the substrates 'W' before the process treatment, from sticking to the substrates 'W' after the process treatment in the process that the index robot 144 introduces and withdraws the substrates 'W' into and out.

The transferring chamber 240 transfers the substrate 'W' between any two of the buffer unit 220 and the process chamber 260, and between the process chambers 260. A guide rail 242 and a main robot 244 are provided in the transferring chamber 240. The guide rail 242 is disposed such that the longitudinal direction thereof is parallel to the first direction 12. The main robot 244 is installed on the guide rail 242 to linearly move in the first direction 12 on the guide rail 242. The main robot 244 may contain a base 244a, a body 244b, and a main arm 244c. The base 244a may be installed to be movable along the guide rail 242. The body 244b may be joined to the base 244a. The body 244b may be provided to be movable on the base 244a in the third direction 16. Furthermore, the body 244b may be provided to be rotatable on the base 244a. The main arm 244c may be coupled to the body 244b such that the main arm 244c is movable forward and backward with respect to the body 244b. A plurality of main arms 244c may be provided, and may be driven independently from each other. The main arms 244c are disposed to be stacked while being spaced apart from each other in the third direction 16.

The process chambers 260 are divided into a plurality of groups, apparatuses for treating substrates belonging to in the same group of process chambers 260 have the same structures, and apparatuses for treating substrates belonging to different groups of the process chambers 260 have mutually different structures. For example, when the process chambers 260 are divided into two groups, a first group of process chambers 260 are provided at one side of the transferring chamber 240, and a second group of process chambers 260 may be provided at an opposite side of the transferring chamber 240. Alternatively, the first group of process chambers 260 may be provided at a lower layer and the second group of process chambers 260 may be provided at an upper layer, at opposite sides of the transferring chamber 240. The first group of process chambers 260 and the second group of process chambers 260 may be divided depending on the types of employed chemicals and the types of manner for using the chemicals. Unlike, the first group of process chambers 260 and the second group of process chambers 260 may be provided such that processes may be sequentially performed with respect to one substrate 'W'. For example, a pretreatment process to prepare for etching the substrate 'W' is performed with respect to the substrate 'W' in the first group of process chamber 260, and an etch process may be performed in the second group of process chambers 260. For example, a plasma treating unit 250 (i.e., a plasma treatment unit) may be provided in the first group of process chambers 260, and a liquid treating unit 300 (i.e., a liquid treatment unit) may be provided in the second group of process chambers 260. For example, the plasma treating unit 250 and the liquid treating unit 300 may be provided in parallel. Alternatively, the plasma treating unit 250 and the liquid treating unit 300 may be provided to face each other based on the first direction 12.

Figure 2:
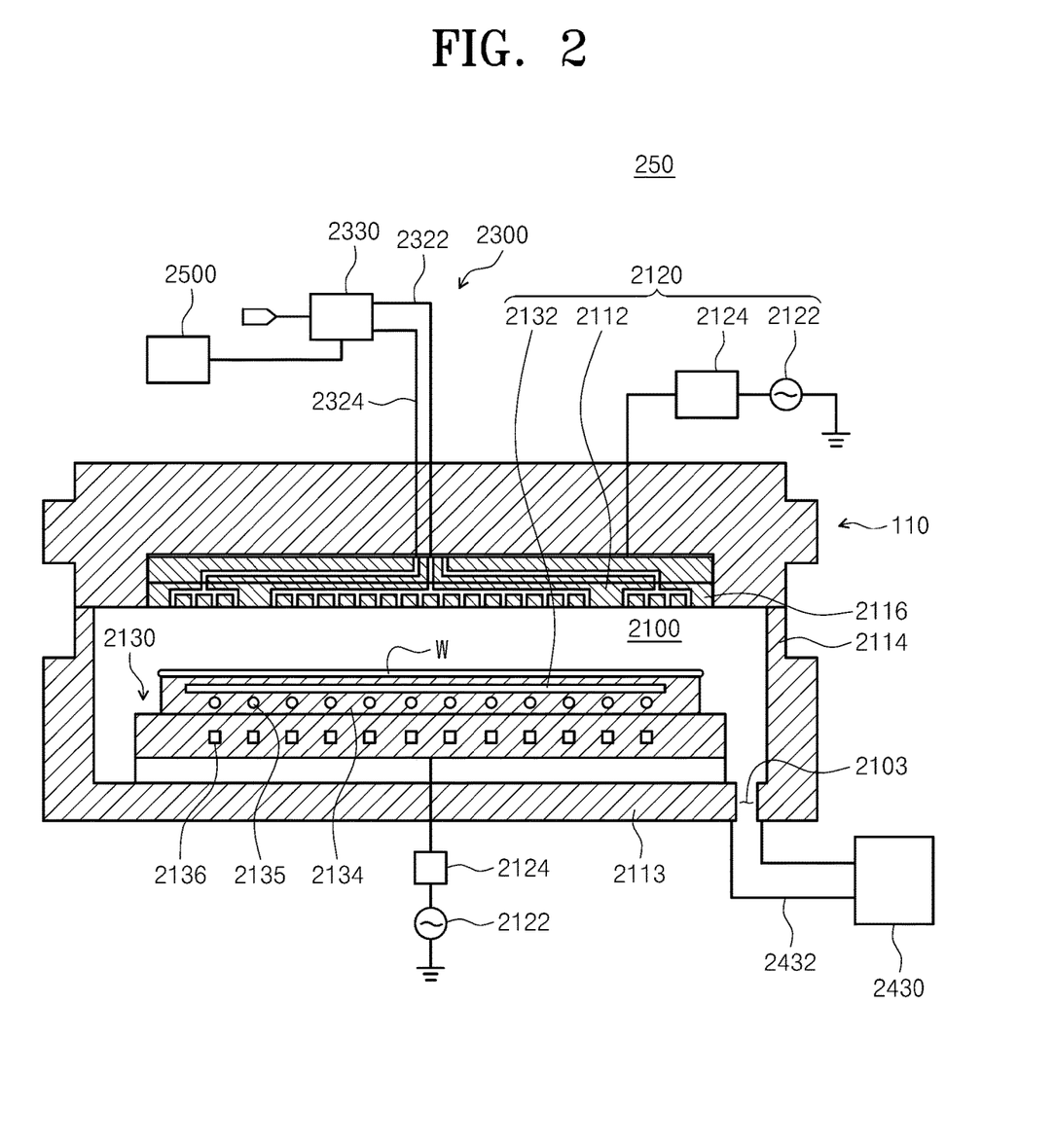
FIG. 2 is a sectional view illustrating a plasma treatment unit, according to an embodiment of the inventive concept.
Figure 3:
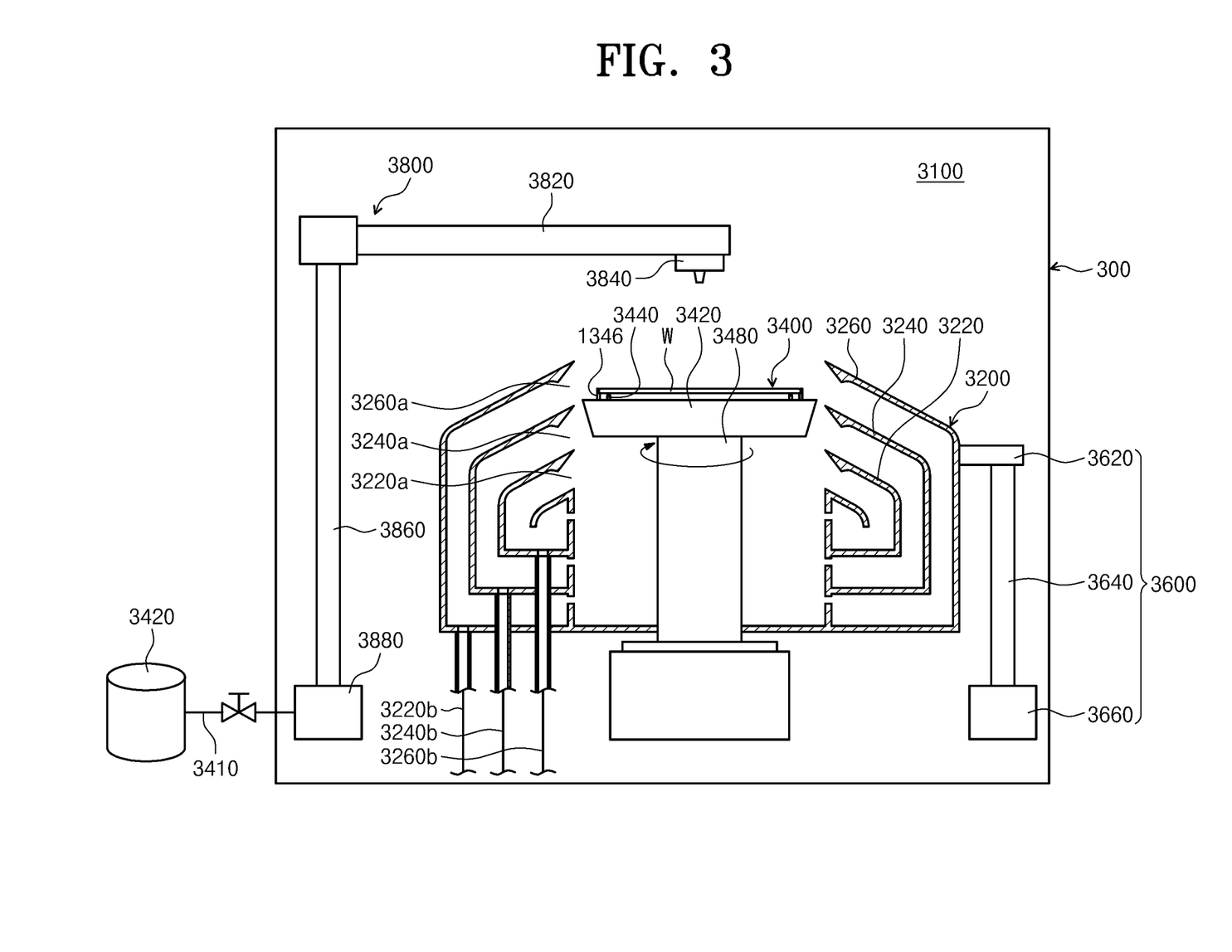
FIG. 3 is a sectional view illustrating a liquid treatment unit, according to an embodiment of the inventive concept.

Hereinafter, the plasma treating unit 250 and the liquid treating unit 300 will be described with reference to FIGS. 2 and 3. FIGS. 2 and 3 are views schematically illustrating the plasma treating unit 250 and the liquid treating unit 300, according to an embodiment of the inventive concept.

Referring to FIG. 2, the plasma treating unit 250 includes a process chamber 110, a gas supply unit 2300, a plasma source 2120, and a support unit 2130.

The process chamber 110 is provided therein with a treatment space 2100 for performing a process. For example, the process chamber 110 includes a metal sidewall 2114 and a metal base 2113. The metal sidewall 2114 and the metal base 2113 are grounded. An exhaust hole 2103 is formed in the metal base 2113. The exhaust hole 2103 is connected to an exhaust line 2432. A vacuum pump 2430 is connected to the process chamber 110 through the exhaust line 2432. The vacuum pump 2430 exhausts an inner part of the process chamber 110 such that the inner part of the process chamber 110 is maintained with an appropriate pressure. Gas remaining in the process chamber 110 is exhausted through the exhaust line 2432. Accordingly, the gas may be discharged out of the process chamber 110. In addition, the pressure of an inner space of the process chamber 110 is reduced to specific pressure through the exhaust process.

An opening (not illustrated) is formed in the metal sidewall 2114 of the process chamber 110. The opening serves as a passage for the entrance of the substrate 'W' into the process chamber 110.

The gas supply unit 2300 supplies treatment gas to the treatment space 2100. For example, the gas supply unit 2300 includes a shower head 2116, a central gas supply line 2322, an edge gas supply line 2324, a distributor 2330, and a gas supply source 2500.

The shower head 2116 supplies treatment gas to the treatment space 2100 through a plurality of holes. The shower head 2116 has a plurality of holes (gas spraying holes) 2115a and 2115b. The treatment gas is sprayed through the gas spraying holes 2115a and 2115b. The shower head 2116 has the plurality of gas spraying holes 2115a and 2115b. The shower head 2116 has a central area supply unit X1 and edge area supply units X2. The central area supply unit X1 sprays the treatment gas to the central area of the substrate 'W' through the gas spraying hole 2115a. The edge area supply unit X2 sprays the treatment gas to an edge area of the substrate 'W' through the gas spraying hole 2115b.

The central gas supply line 2322 supplies the treatment gas to the central area supply unit X1 of the shower head 2116. The edge gas supply line 2324 supplies the treatment gas to the edge area supply unit X2 of the shower head 2116. The distributor 2330 distributes an amount of the treatment gas from the gas supply source 2500 to the central gas supply line 2322 and the edge gas supply line 2324. The treatment gas is supplied to the treatment space 2100 through the gas spraying holes 2115a and 2115b.

The plasma source 2120 excites the treatment gas, which is supplied to the treatment space 2100, to be in a plasma state. For example, the plasma source 2120 includes a first electrode 2112, a second electrode 2132, a power supply 2122 and a matching network 2124.

The first electrode 2112 and the second electrode 2132 are disposed inside the process chamber 110 to face each other. For an example, the first electrode 2112 is provided to be coupled to an upper portion of the shower head 2116. The first electrode 2112 is provided to be electrically connected to the shower head 2116. The second electrode 2132 is provided in the support unit 2130. The power supply 2122 provides voltage to the first electrode 2112 and the second electrode 2132 through the matching network 2124.

The support unit 2130 supports the substrate 'W' in the treatment space 2100. The substrate 'W' is placed on the second electrode 2132. For example, the support unit 2130 includes an electrostatic chuck 2134, the second electrode 2132, a heating member 2135, and a cooling member 2136.

The electrostatic chuck 2134 holds the substrate 'W' by electrostatic force. The first electrode 2112 and the second electrode 2132 are positioned to face each other, and the substrate 'W' is biased by the voltage applied to each electrode. Accordingly, charge particles in the process chamber 110 are attracted toward the substrate 'W'. The heating member 2135 and the cooling member 2136 maintain the substrate 'W' at a process temperature during the process. For example, the heating member 2135 may be provided in the form of a heating wire, and the cooling member 2136 may be provided in the form of a cooling line through which a refrigerant flows.

Referring to FIG. 3, the liquid treating unit 300 includes a cup 3200, a support unit 3400, an elevating unit 3600, and a liquid discharging unit 3800. The cup 3200 has a treatment space for perform a substrate treating process and an upper portion which is open. The cup 3200 has an inner recovery tub 3220, an intermediate recovery tub 3240, and an external recovery tub 3260. The inner recovery tub 3220, the intermediate recovery tub 3240, and the external recovery tub 3260 recover mutually different treatment liquids of treatment liquids used for the process. The inner recovery tub 3220 is provided in the shape of an annular ring to surround the support unit 3400, the intermediate recovery tub 3240 is provided in the shape of an annular ring to surround the inner recovery tub 3220, and the external recovery tub 3260 is provided in the shape of an annular ring to surround the intermediate recovery tub 3240.

An inner space 3220a of the inner recovery tub 3220, a space 3240a between the inner recovery tub 3220 and the intermediate recovery tub 3240, and a space 3260a between the intermediate recovery tub 3240 and the external recovery tub 3260 serve as inlets to introduce the treatment liquid into the inner recovery tub 3220, the intermediate recovery tub 3240, and the external recovery tub 3260, respectively. The inner recovery tub 3220, the intermediate recovery tub 3240, and the external recovery tub 3260 are connected to recovery lines 3220b, 3240b, and 3260b vertically extending downward from the bottom surface thereof. The recovery lines 3220b, 3240b and 3260b are to discharge treatment liquids introduced into the inner recovery tub 3220, the intermediate recovery tub 3240, and the external recovery tub 3260, respectively. The discharged treatment liquids may be recycled through an external treatment liquid recycling system (not illustrated).

The elevating unit 3600 linearly moves the cup 3200 in the vertical direction. As the cup 3200 moves upward and downward, a relative height of the cup 3200 to the support unit 3400 is changed. The elevating unit 3600 has a bracket 3620, a moving shaft 3640, and a driving unit 3660. The bracket 3620 is fixedly installed on an outer wall of the cup 3200. The moving shaft 3640 moving by the driving unit 3660 in the vertical direction is fixedly coupled to the bracket 3620. When the substrate 'W' is placed on the support unit 3400 or lifted from the support unit 3400, the cup 3200 moves down such that the support unit 3400 protrudes out of the upper portion of the cup 3200. The height of the cup 3200 is adjusted such that the treatment liquid is introduced into the recovery tubs 3220, 3240, 3260 preset depending on the type of the treatment liquid supplied to the substrate 'W' when the process is performed. Alternatively, the elevating unit 3600 may move the support unit 3400 in the vertical direction.

The liquid discharging unit 3800 may supply the treatment liquid on the substrate 'W' in the process of treating the substrate 'W'. The liquid discharging unit 3800 has a support shaft 3860, a driving unit 3880, a nozzle support member 3820, and a nozzle 3840. The support shaft 3860 has a longitudinal direction provided in the third direction 16, and the driving unit 3880 is coupled to a lower end of the support shaft 3860. The driving unit 3880 rotates and moves up and down the support shaft 3860. The nozzle support member 3820 is coupled to an end of the support shaft 3860, which is opposite to an end of the support shaft 386 coupled to the driving unit 3880, perpendicularly to the support shaft 386. The nozzle 3840 is installed on the bottom surface of an end portion of the nozzle support member 3820.

The nozzle 3840 is moved between a process position and a standby position by the driving unit 3880. The process position is a position at which the nozzle 3840 is arranged at the vertical upper portion of the cup 3200, and the standby position is a position that is out of the vertical upper portion of the cup 3200. In the process position, the nozzle 3840 is vertically directed to the central area of the substrate 'W', and provides the treatment liquid thereto during a time when the substrate 'W' is being rotated. In the standby position, the nozzle 3840 is set aside from the vertical upper portion of the cup 3200.

The liquid discharging unit 3800 may receive a liquid from a liquid storage tank 3420. The liquid storage tank 3420 is connected to a liquid supply line 3410. A valve may be provided in the liquid supply line 3410.

Figure 4:
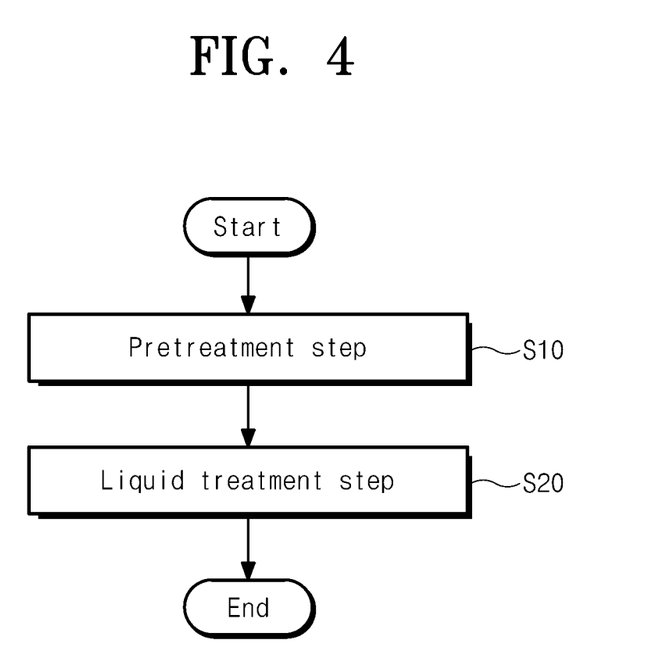
FIG. 4 is a flowchart illustrating a method for treating a substrate, according to an embodiment of the inventive concept.
Figure 5:
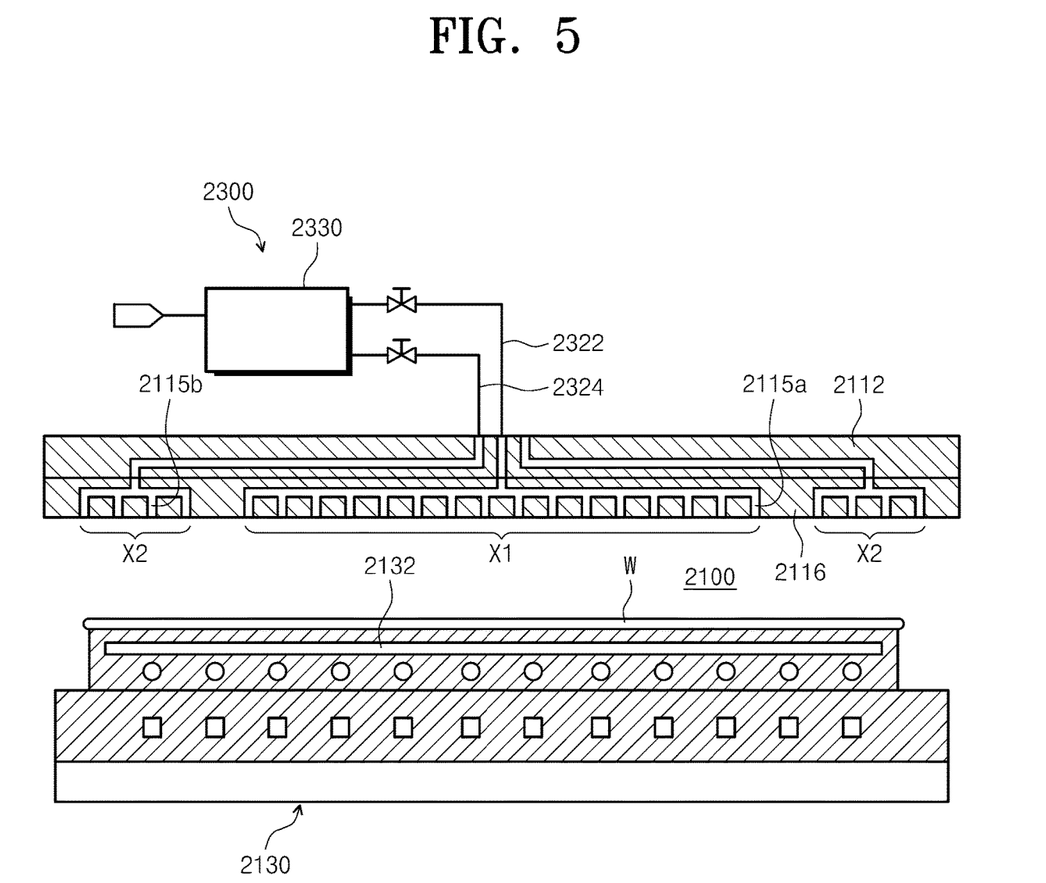
FIGS. 5 to 8 are views sequentially illustrating a method for treating a substrate, according to an embodiment of the inventive concept
Figure 6:
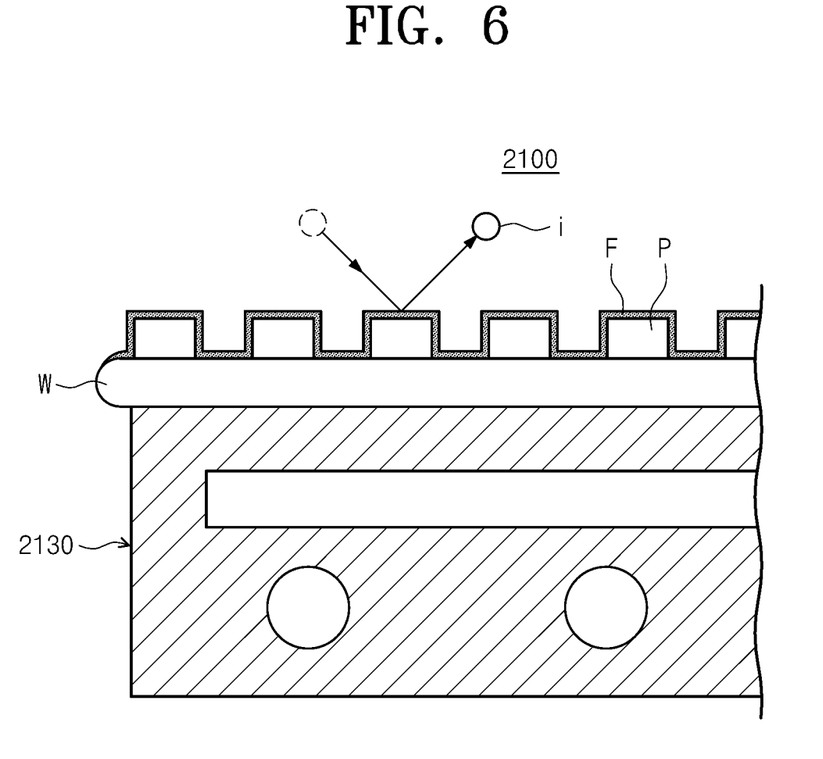
Figure 7:
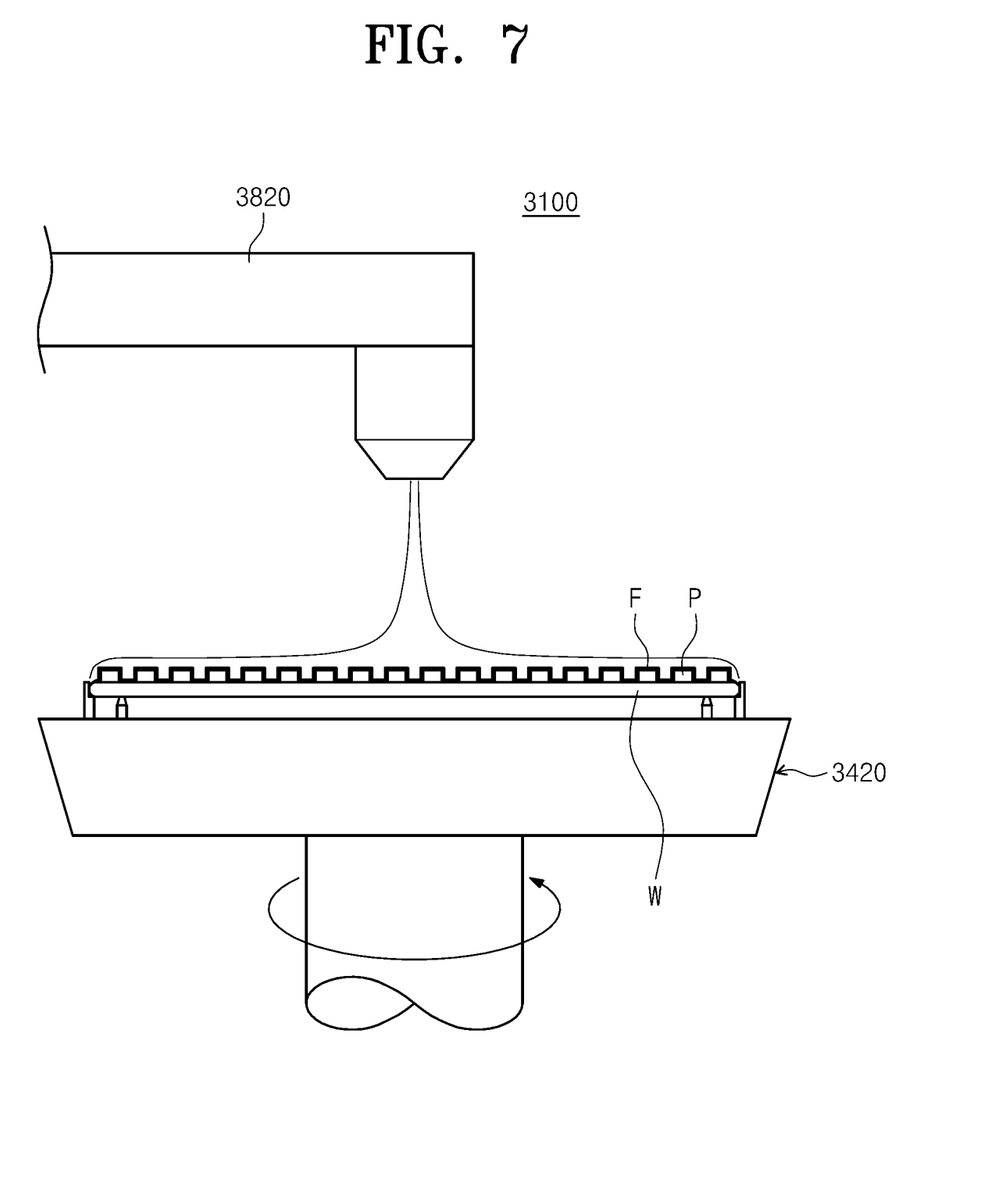
Figure 8:
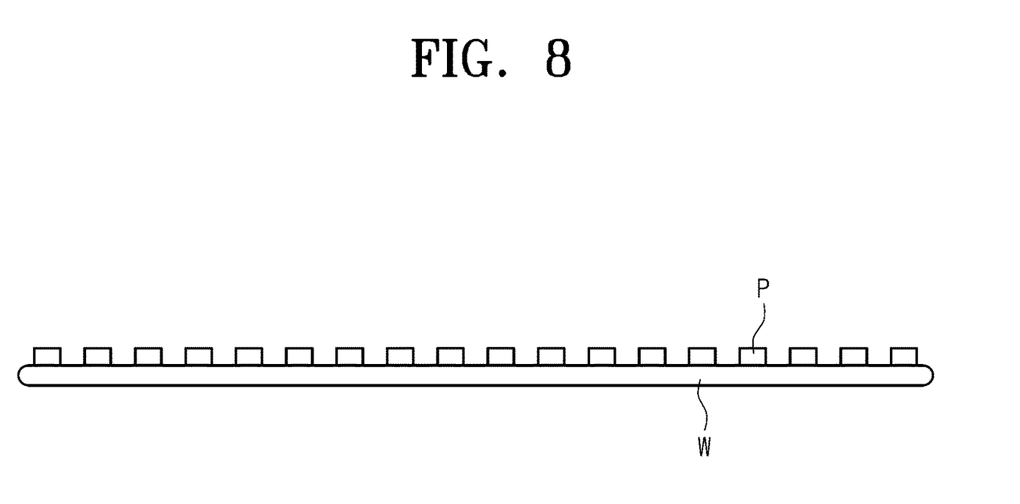

Hereinafter, a method for treating a substrate will be described with reference to FIGS. 4 to 8, according to the inventive concept. A controller (not illustrated) may control each processing unit to perform the method for treating the substrate according to the inventive concept. FIG. 4 is a view illustrating a method for treating a substrate, according to an embodiment of the inventive concept, and FIGS. 5 to 8 are views sequentially illustrating the method for treating the substrate, according to an embodiment of the inventive concept. In detail, FIG. 5 illustrates that a substrate is treated in a plasma treating unit, FIG. 6 illustrates that plasma ions collide with a film formed on the substrate, FIG. 7 illustrates that the substrate is treated in the liquid treating unit, and FIG. 8 illustrates that the film is removed from a substrate.

According to the inventive concept, the method for treating the substrate includes a pretreatment step (S10) and a liquid treatment step (S20). The pretreatment step (S10) is performed by the plasma treating unit 250. In the pretreatment step (S10), the plasma treating unit 250 performs surface-treating on a film formed on a substrate by a treatment gas in a plasma state. The liquid treatment step (S20) is performed by the liquid treating unit 300. In the liquid treatment step (S20), the liquid discharging unit 3800 supplies a treatment liquid onto the substrate to remove the film from the substrate.

In the pretreatment step (S10), the substrate 'W' having a treatment surface, on which a film 'F' is formed, is introduced into the plasma treating unit 250. The substrate 'W' is seated between the first electrode 2112 and the second electrode 2132. In the pretreatment step (S10), the treatment gas is supplied into the treatment space 2100. The treatment gas is sprayed onto the substrate 'W' through the central area supply unit X1 and the edge area supply units X2 of the shower head 2116. The treatment gas supplied into the treatment space 2100 is excited to be in the plasma state between the first electrode 2112 and the second electrode 2132 thereafter.

Referring to FIG. 6, ions 'i' contained in the treatment gas in the plasma state collides with the substrate 'W'. In this case, the ions 'i' colliding with the substrate 'W' break the binding energy of a film 'F' formed on a pattern 'P' of the substrate 'W'. Accordingly, the film 'F' is changed to be in a state in which the film 'F' is easily removed from the substrate 'W'. For example, in the pretreatment step (S10), the film 'F' formed on the substrate 'W' is not etched, but is subject to the surface-treating such that the film 'F' becomes softened as the binding energy is weakened. In the pretreatment step (S10), as the film 'F' is subject to the surface-treating, the etching efficiency and the etching uniformity of the substrate 'W' are increased in the liquid treatment step (S20) to be performed thereafter.

For example, to allow the treatment gas in the plasma state to weaken only the binding energy of the film 'F' without etching the film 'F' in the pretreatment step (S10), the type of the treatment gas, which is supplied, an amount of the treatment gas, a supply time of the treatment gas, or a voltage to excite the treatment gas to be in the plasma state may be adjusted in the pretreatment step (S10).

The film 'F' formed on the substrate 'W' in the pretreatment step (S10) becomes more softened than the film 'F' before the pretreatment step (S10) is performed. For example, the film 'F' formed on the substrate 'W' is a natural oxide film ($SiO_2$). To soften the natural oxide film ($SiO_2$), the treatment gas supplied to the plasma treating unit 250 may include ammonia ($NH_3$) or fluorocarbon gases, from inert gas, which has no chemical activity, such as hydrogen ($H_2$), helium (He), neon (Ne), or argon (Ar).

The extent that the ions 'i' collide with the substrate 'W' is varied depending on the weight of gas in the process that the ions 'i' collide with the substrate 'W'. For example, heavier gas, such as argon (Ar), applies, to the substrate 'W', an impact greater than that of lighter gas such as hydrogen ($H_2$). Accordingly, the film 'F' may be unintentionally etched. Therefore, to prevent the gas in a plasma state from etching the film 'F', the lighter gas may be selected.

For example, the treatment gas supplied in the pretreatment step (S10) may include gas containing hydrogen atoms (H). For example, the treatment gas may include a hydrogen gas ($H_2$) or an ammonia gas ($NH_3$).

In addition, as described above, to avoid that the film 'F' is etched in the pretreatment step (S10), the type of treatment gas, an amount of the treatment gas, a supply time of the treatment gas, or a voltage to excite the treatment gas to be in the plasma state may be adjusted to the extent that the film is not etched.

For example, the treatment liquid is supplied to the central area of the substrate 'W' rotating in the liquid treatment step (S20). Accordingly, the edge area of the substrate 'W' is more etched than the central area of the substrate 'W'. Accordingly, different amounts of gas may be supplied through the central area supply unit X1 and the edge area supply units X2 in the pretreatment step (S10) such that the substrate 'W' is prevented from being more etched at the central area of the substrate 'W' than the edge area of the substrate 'W'.

For example, the distributor 2330 distributes a larger amount of gas to the edge gas supply line 2324 rather than the central gas supply line 2322. Accordingly, the larger amount of gas is supplied through the edge area supply units X2 rather than the central area supply unit X1. Accordingly, a film formed at the edge area of the substrate 'W' becomes more softened than a film formed at the central area of the substrate 'W' in the pretreatment step (S10). Therefore, although an amount of a treatment liquid reaching the edge area of the substrate 'W' is smaller than an amount of a treatment liquid reaching the central area of the substrate 'W', the entire area of the substrate 'W' is uniformly etched in the liquid treatment step (S20). For example, an amount of treatment gas supplied through the central area supply unit X1 and the edge area supply unit X2 in the pretreatment step (S10) may be adjusted based on the difference in etching extent made in the liquid treatment step (S20).

When the pretreatment step (S10) is terminated, the substrate 'W' is moved, by the transferring unit, from the plasma treating unit 250 to the liquid treating unit 300. For example, the transferring unit may be the main robot 244 provided in the transferring chamber 240 of FIG. 1.

In the liquid treatment step (S20), the substrate 'W' is placed on the support unit 3400 provided in the liquid treating unit 300, as illustrated in FIG. 7. The support unit 3400 supports and rotates the substrate 'W' during the process. The treatment liquid is coated on the substrate 'W' rotating. For example, the treatment liquid is supplied to the central area of the substrate 'W' and spread to the edge area of the substrate 'W' as the substrate 'W' rotates by the support unit. The treatment liquid coated on the substrate 'W' treats the surface of the substrate.

For example, the treatment liquid is an etchant to etch the substrate 'W'. For example, the treatment liquid may be SC-1, APM, Dilute HF (DHF), or BOE. In addition, the treatment liquid may be all types of chemicals used for native oxide etching to remove a natural oxide film ($SiO_2$). For example, according to the inventive concept, the treatment liquid may be a DHF. The DHF etches $SiO_2$ from the surface of the substrate 'W'. As illustrated in FIG. 8, $SiO_2$ is removed from the substrate 'W' by the treatment liquid applied to the substrate 'W' such that only the pattern 'P' remains on the substrate 'W'.

The above embodiment has been made in that the treatment gas supplied to the treatment space 2100 is excited to be in the plasma state inside the treatment space 2100. Unlike, the treatment gas may be supplied to the treatment space 2100 after being excited to be in the plasma state.

The above embodiment has been described in that the plasma source 2120 includes an electrode placed at an upper portion of the substrate and an electrode placed at a lower portion of the substrate. However, unlike, the plasma source 2120 may include only the electrode placed at the upper portion of the substrate.

The above embodiment has been described in that the plasma source 2120 includes an electrode placed at an upper portion of the substrate and an electrode placed at a lower portion of the substrate. However, unlike, an antenna may be provided instead of the electrode placed at the upper portion of the substrate.

The above embodiment has been described in that treatment gas is hydrogen gas ($H_2$) supplied to the treatment space in the pretreatment step (S10). However, according to another embodiment, another gas of the above-described gas except for hydrogen gas may be supplied, and an amount of the treatment gas, a supply time of the treatment gas, or a voltage to generate plasma may be adjusted such that etching is not performed in the pretreatment step (S10).

The above embodiment has been described in that different amounts of gas may be supplied to the central area of the substrate and the edge area of the substrate in the pretreatment step (S10) to solve a problem related to the difference in an etching extent between the central area of the substrate and the edge area of the substrate in the liquid treatment step (S20). However, according to another embodiment, different supply times of gas may be applied to the central area of the substrate and the edge area of the substrate in the pretreatment step (S10) to solve the problem related to the difference in the etching extent between the central area of the substrate and the edge area of the substrate in the liquid treatment step (S20).

The above embodiment has been described in that the film formed on the substrate is a natural oxide film ($SiO_2$). Accordingly, the above embodiment has been described in that the etchant supplied in the liquid treatment step (S20) is DHF. However, unlikely, the film formed on the substrate may be a silicon nitride film. Accordingly, the etchant supplied in the liquid treatment step (S20) may be a liquid to remove the silicon nitride film. For example, the treatment liquid may be an aqueous solution of phosphoric acid ($H_3PO_4$) or diluted sulfuric acid ($H_2SO_4$).

The above embodiment has been described in that a larger amount of gas is supplied to the edge area of the substrate rather than the central area of the substrate in the pretreatment step (S10) as the central area of the substrate is more etched than the edge area of the substrate in the liquid treatment step (S20). However, according to another embodiment, a specific area of the substrate may be more etched instead of the central area of the substrate depending on etching manners for the substrate. Accordingly, a larger amount of gas may be supplied to an area which is less etched in the pretreatment step (S10).

According to an embodiment of the inventive concept, since the film is not etched, but only the binding energy is weakened in the pretreatment step (S10), a by-product, which is produced as a film formed on the substrate is etched through a conventional dry etch manner, is not formed. In addition, the damage to the substrate by plasma, which occurs in the conventional dry etch manner, may be minimized.

In addition, according to an embodiment of the inventive concept, as the property of the film is changed such that the film becomes softened in the pretreatment step (S10) before the liquid treatment step (S20), the substrate is sufficiently etched in the liquid treatment step (S20). Accordingly, the time taken to etch may be reduced in the liquid treatment step (S20), the amount of treatment liquid may be minimized in the liquid treatment step (S20), and contaminants resulting from the treatment liquid may be minimized.

In addition, according to an embodiment of the inventive concept, since particles that may be generated in the pretreatment step (S10) are removed in the liquid treatment step (S20), particles produced after the process may be minimized.

In addition, according to an embodiment of the inventive concept, as an amount of treatment liquid supplied to each area of the substrate is adjusted in the pretreatment step (S10), the substrate may be uniformly etched throughout the entire area thereof in the liquid treatment step (S20).

According to the inventive concept, the damage to the substrate may be minimized in the process of etching the substrate.

According to the inventive concept, the by-products may be minimized in the process of etching the substrate.

According to the inventive concept, an amount of etchant used may be minimized in the process of etching the substrate.

According to the inventive concept, the etching efficiency may be increased in the process of etching the substrate.

According to the inventive concept, the entire area of the substrate may be uniformly etched in the process of etching the substrate.

The above description has been made for the illustrative purpose. Furthermore, the above-mentioned contents describe the exemplary embodiment of the inventive concept, and the inventive concept may be used in various other combinations, changes, and environments. That is, the inventive concept may be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to limit the inventive concept to the disclosed embodiments Furthermore, it should be construed that the attached claims include other embodiments.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for processing a substrate, the apparatus comprising:
   a controller;
   a plasma treatment unit coupled to the controller; and
   a liquid treatment unit coupled to the controller coupled to the plasma treatment unit,
   wherein the liquid treatment unit includes:
   a cup having a treatment space in the cup;
   a liquid supply unit including a nozzle and configured to supply a treatment liquid to the substrate supported by a rotating substrate chuck,
   wherein the controller is configured to control:
   the plasma treatment unit to collide ions of a treatment gas in a plasma state with a film of the substrate to weaken a binding energy of the film, without etching the film; and the liquid treatment unit to etch the film from the substrate, transferred from the plasma treatment unit, with a treatment liquid, wherein the plasma treatment unit includes:

a process chamber having a treatment space inside the process chamber;

a gas supply unit including a shower head and configured to supply the treatment gas in two different amounts per a unit area of the substrate into the process chamber; and a plasma source configured to excite the treatment gas to be in the plasma state, wherein the gas supply unit is configured to supply a first amount, per a unit area of the substrate, of the treatment gas to an edge area of the substrate and a second amount, per a unit area of the substrate, of the treatment gas to a central area of the substrate, wherein the first amount of the treatment gas is different from the second amount of the treatment gas, and wherein the shower head includes:

a central area supply unit including a plurality of first gas spraying holes and configured to spray the treatment gas to the central area of the substrate via the plurality of first gas spraying holes; and an edge area supply unit including a plurality of second gas spraying holes and configured to spray the treatment gas to the edge area of the substrate via the plurality of second gas spraying holes.

2. The apparatus of claim 1, further including:

a gas supply source supplying the treatment gas to the plasma treatment unit, wherein the shower head is configured to supply the treatment gas from the gas supply source into the process chamber, wherein the gas supply unit further includes:

a central gas supply line connecting the gas supply source to the plurality of first gas spraying holes of the shower head; and an edge gas supply line connecting the gas supply source to the plurality of second gas spraying holes of the shower head, and wherein each of the central gas supply line and the edge gas supply line supplies the same gas of the treatment gas from the gas supply source to the shower head.

3. The apparatus of claim 2, wherein a first outer boundary of the plurality of first gas spraying holes of the central area supply unit is greater than a second outer boundary of the plurality of second gas spraying holes of the edge area supply unit in width.

4. The apparatus of claim 3, wherein the controller is configured to:

control the gas supply unit such that the first amount, per a unit area of the substrate, of the treatment gas is supplied through the edge area supply unit and the second amount, per a unit area of the substrate, of the treatment gas is supplied through the central area supply unit, and wherein the first amount of the treatment gas is greater than the second amount of the treatment gas.

5. The apparatus of claim 1, wherein the nozzle of the liquid supply unit is configured to move between a process position in which the nozzle is vertically directed to the central area of the substrate and a standby position in which the nozzle is set aside from a vertical upper portion of the cup, and wherein the nozzle is configured to supply, in the process position, the treatment liquid onto the central area of the substrate.

6. The apparatus of claim 1, wherein the film is a natural oxide film.

7. The apparatus of claim 1, wherein the treatment gas includes a hydrogen atom.

8. The apparatus of claim 7, wherein the treatment gas includes hydrogen gas or ammonia gas, and wherein the treatment liquid includes fluorine.

* * * * *